(12) United States Patent
Cohen

(10) Patent No.: US 7,811,883 B2
(45) Date of Patent: Oct. 12, 2010

(54) METHOD OF FORMING A NANOWIRE BASED NON-VOLATILE FLOATING-GATE MEMORY

(75) Inventor: Guy M. Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/121,044

(22) Filed: May 15, 2008

(65) Prior Publication Data

US 2009/0117694 A1 May 7, 2009

Related U.S. Application Data

(62) Division of application No. 11/195,889, filed on Aug. 3, 2005, now Pat. No. 7,391,074.

(51) Int. Cl.
*H01L 21/8247* (2006.01)

(52) U.S. Cl. .............. 438/257; 257/E21.179; 257/E21.422; 257/E21.68; 438/201; 438/211; 438/593; 977/762; 977/814; 977/891; 977/943

(58) Field of Classification Search .......... 257/E21.179, 257/E21.422, E21.68; 438/201, 211, 257, 438/593; 977/762, 814, 891, 943
See application file for complete search history.

(56) References Cited

U.S. PATENT DOCUMENTS

| 5,405,454 | A | 4/1995 | Hirai et al. | |
|---|---|---|---|---|
| 6,313,015 | B1 | 11/2001 | Lee et al. | |
| 7,045,851 | B2 | 5/2006 | Black et al. | |
| 7,087,920 | B1 | 8/2006 | Kamins | |
| 7,667,260 | B2 * | 2/2010 | Sandhu et al. | 257/316 |
| 2005/0201149 | A1 | 9/2005 | Duan et al. | |
| 2006/0220094 | A1 * | 10/2006 | Lojek | 257/315 |
| 2008/0277719 | A1 * | 11/2008 | Choi et al. | 257/324 |
| 2008/0308858 | A1 * | 12/2008 | Sandhu et al. | 257/316 |
| 2010/0025660 | A1 * | 2/2010 | Jain et al. | 257/24 |
| 2010/0112778 | A1 * | 5/2010 | Sandhu et al. | 438/400 |

* cited by examiner

*Primary Examiner*—Anh Phung
*Assistant Examiner*—Michael Lulis
(74) *Attorney, Agent, or Firm*—Scully, Scott, Murphy & Presser, P.C.; Vazken Alexanian

(57) ABSTRACT

A non-volatile memory transistor with a nanocrystal-containing floating gate formed by nanowires is disclosed. The nanocrystals are formed by the growth of short nanowires over a crystalline program oxide. As a result, the nanocrystals are single-crystals of uniform size and single-crystal orientation.

10 Claims, 5 Drawing Sheets

METHOD OF FORMING A NANOWIRE BASED NON-VOLATILE FLOATING-GATE MEMORY

RELATED APPLICATION

This application is a divisional of U.S. patent application Ser. No. 11/195,889, filed Aug. 3, 2005, which is related to and co-assigned U.S. Patent Application Publication No. 2004/0256662 A1, now U.S. Pat. No. 7,045,8511 issued on May 16, 2006.

FIELD OF THE INVENTION

The present invention relates to electronic devices based on semiconductor nanowires, and more particularly to a floating-gate non-volatile memory which includes nanocrystals (i.e., nanocrystal-based floating-gate non-volatile memory) and methods of fabricating such a memory.

BACKGROUND OF THE INVENTION

When compared with conventional floating-gate memories, floating-gate memories that are based on nanocrystals have the following advantages: (1) They are less susceptible to defects in the program oxide since the charge is stored on isolated nanocrystal sites. (2) They can store two bits per cell by reversing the role of the source and drain since the charge is localized at the injection point. (3) They have potentially lower voltage operation and higher retention.

In previous reports, see, for example, S. Tiwari, et al., Appl. Phys. Lett., 68, p. 1377 (1996) and M. L. Ostraat, et al., Appl. Phys. Lett., 79, 433 (2003), the nanocrystals were typically formed by spontaneous decomposition during chemical vapor deposition (CVD) or aerosol deposition. This led to a wide spread in the nanoparticles size and position. More recently, Guarini, et al. IEDM 2003 p. 541 (2003) have demonstrated a nanocrystal-based floating-gate memory where the nanocrystals were defined by a self-assembled polymer mask and conventional reactive ion etching (RIE).

The technique described by Guarini, et al. improved the nanocrystals uniformity, but has the following drawbacks: First, the nanocrystals are cut out of a continuous film of amorphous silicon or polycrystalline silicon and hence the nanocrystals may be comprised of several single-crystal grains that are lumped together. Therefore, charge storage in each of the lumped nanocrystals is likely to depend on grain boundaries and the surface of the nanocrystals, which properties are difficult to control. Second, the size of the nanocrystals is defined by the pores size in the polymer mask, which is dependent on the spacing between pores. Thus, independent control over the size of the nanocrystals and the spacing between nanocrystals is not possible. Third, the nanocrystals cannot be formed directly with the polymer mask since the mask defines the negative image of the nanocrystals (i.e., pores). As a result, a two step reactive-ion etch (RIE) process is required. Additionally, RIE damage may be another factor for charge trapping on the nanocrystal surface. Fourth, passivation of the nanocrystal surface is very limited since the nanocrystals are formed by filling cavities in an oxide hard mask.

In view of the drawbacks mentioned above, there is still a need for providing nanocrystal-based floating-gate non-volatile memories in which the nanocrystals are fabricated by techniques which avoid the problems of prior art fabrication techniques.

SUMMARY OF THE INVENTION

The present invention provides a nanocrystal-based floating-gate non-volatile memory where the nanocrystals are fabricated by growth of single-crystal nanowires. The nanowires of the present invention are characterized as having a diameter of about 1 in to less than about 1 micron, preferably about 1 nm to about 20 nm and a length that is about 200 nm or less, preferably from about 3 to about 30 nm. The nanowires are completely filled nanomaterials, i.e., they are solid wires. It is noted that the nanowires have at least one distinctive diameter within the range mentioned herein. The nanowires within a given set used in the present invention are uniform meaning that they have substantially the same size, length, diameter, and crystal orientation. In one of the embodiments of the present invention, the nanocrystals consist of two distinctive groups of nanowires. Each group comprises of a plurality of uniform nanowires as defined above. However, the size of the nanowires in the first group is different than that of the second group.

Specifically, the nanocrystals are formed by growing short segments of nanowires over a crystalline oxide, which serves as the program oxide. Following the growth, the surface of each of the nanowires can be passivated by suitable surface treatment and the deposition of a suitable control oxide. The device fabrication is completed by topping the control oxide with a gate conductor and forming the device's source and drain.

The use of nanowires as nanocrystals has the following advantages: First, nanowire growth provides good size and shape control. Second, the nanowires formed utilizing the inventive methods are single-crystal with a well-defined orientation. Third, the size of each of the nanowires is decoupled from their density. Fourth, the surface of each of the nanowires can be passivated using well-established silicon passivation techniques, and a high-quality control oxide can be used. Fifth, the use of nanowires does not require lithography, or RIE. The latter circumvents damage to the control oxide and the nanocrystals' surface.

In a first aspect of the present invention, a non-volatile memory device with a floating-gate comprising nanowires for storing the charge is described. The nanowires replace the nanocrystals used in prior-art structures. Specifically, the semiconductor structure of the present invention comprises:

a crystalline program oxide located on a surface of a semiconductor substrate;

a floating gate comprising a plurality of nanowires located over said program oxide;

a control oxide located over said floating gate and said program oxide; and a gate conductor located over said control oxide.

In a second aspect of the present invention, a method for fabricating the non-volatile memory is described. In accordance with the inventive method, catalyst particles are placed over a crystalline oxide. Each catalyst nucleates one nanowire that grows perpendicular to the substrate surface. Catalyst is then removed from the tip of each nanowire, and a conformal control dielectric is deposited. A gate conductor is deposited and fills the space between the nanowires. The gate conductor is patterned to define a gate and self-aligned source and drain regions are formed adjacent to the gate. Contacts to the source, drain, and gate are made to complete the device fabrication.

In general terms, the method of the present invention includes the steps of:

epitaxially growing a crystalline program oxide over a surface of a semiconductor substrate;

placing a plurality of catalyst particles over said program oxide;

growing nanowires from said catalyst particles;

forming a control oxide over said nanowires and said program oxide;

forming a gate conductor over said control oxide; and patterning said gate conductor.

In another aspect of the invention, self-limited growth of nanowires is used to form the nanocrystals. With this method, the catalyst particles required for the growth of the nanowires deplete gradually after the initiation of the nanowire growth and the nanowire growth halts once there is no more catalyst left. In general terms, this method of the present invention includes the steps of:

forming a program oxide over a surface of a semiconductor substrate;

placing a plurality of catalyst particles over said program oxide;

growing nanowires from said catalyst particles where growth of said nanowires is self-limited due to catalyst loss;

forming a control oxide over said nanowires and said program oxide;

forming a gate conductor over said control oxide; and patterning said gate conductor.

DETAILED DESCRIPTION OF THE INVENTION

The present invention, which discloses a nanowire-based non-volatile memory as well as methods for forming the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

It is noted that the discussion that follows is described for making Si-containing nanowires and silicon-containing processing. The methods of the present invention can also be produced with other semiconductors such as Ge or III-V compound semiconductors. Use of Si-containing semiconductors such as, for example, Si, SiGe, Si/SiGe, silicon-on-insulator (SOI), silicon germanium-on-insulator (SGOI), SiC or SiGeC are, however, preferred.

Figure 1A:
FIGS. 1A-1E are pictorial representations (through cross sectional views) illustrating the basic processing steps of one embodiment of the present invention for fabricating a floating-gate comprised of short nanowires.

The basic method is shown in FIGS. 1A-1E. A silicon-containing semiconductor substrate 100 such as, for example, Si or a silicon-on-insulator, is used as the starting substrate (FIG. 1A). The Si-containing substrate 100 is typically chosen to have a (111) orientation so that the nanowires growth will be perpendicular to the substrate surface. Although a (111) crystal orientation is preferred, the present invention also contemplates other crystal orientations for the substrate 100. A crystalline program oxide 101 such as, lanthanum oxide ($La_2O_3$), is deposited on the substrate 100. Examples of other oxides that can be deposited epitaxially on the Si-containing substrate 100 are $HfO_2$, $Y_2O_3$, $SrTiO_3$, $La_xY_{1-x}O_3$, and other like oxides. The deposition is epitaxial so the crystalline oxide will mimic the silicon-containing substrate's crystal template and orientation. The deposition method can be molecular beam epitaxy (MBE), atomic layer deposition (ALD), pulsed laser deposition (PLD), or chemical vapor deposition (CVD). The thickness of the program oxide 101 is typically a few nanometers (typically from about 2 to about 3 nm) to allow efficient transfer of charge from the channel to the nanocrystals (both to be subsequently formed).

Figure 1B:
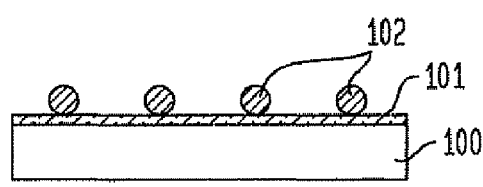

Referring to FIG. 1B, catalyst particles 102 are deposited over the program oxide 102. The catalyst typically consists of gold (Au), however, other metals such as Ga, Al, Ti and Ni can also be used. Spin-coating of a metallic catalyst colloid, such as a gold colloid, can be used to deposit the catalyst. An advantage to the use of metallic colloids is the uniform size of the metallic particles (the particles fall within a narrow size range with a variation smaller than 8%). The catalyst particles 102 can also be formed by other techniques such as evaporation of a metal through pores in a photoresist mask. The pores in the mask, which define the size of the catalyst particles 102, are typically too small to form with current optical lithography techniques. As a result, self-assembly methods for patterning the mask such as reported in K. Guarini, et al., IEDM 2003 p. 541 (2003) and U.S. Patent Application Publication No. 2004/0256662 A1, publication date Dec. 23, 2004, for a diblock copolymer can also be used.

Figure 1C:
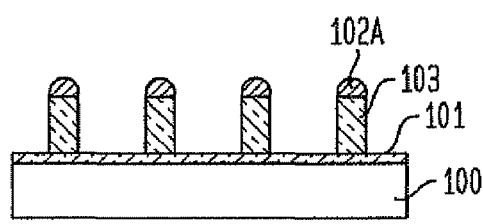

The surface of the oxide 101 and the catalyst particles 102 are cleaned from any organic residue. Any conventional cleaning process such as, for example, oxygen plasma can be used to remove the organic residue. Following the surface clean, epitaxial growth of short nanowires 103 takes place as illustrated in FIG. 1C. The term "short nanowires" as used herein denotes nanowires that have a length of about 200 nm or less, with a length from about 3 to about 30 nm being more typical.

Nanowires 103 are grown perpendicular to the substrate surface, The growth of the nanowires 103 is assisted by the catalyst particles 102 and is typically carried out by chemical vapor deposition (CVD) or plasma enhanced chemical vapor deposition (PECVD). The growth temperature depends on the precursor used. For example, when silane ($SiH_4$) is used to grow silicon nanowires, the growth temperature is typically from about 370° C. to about 500° C. For other precursors such as, for example, silicon tetrachloride ($SiCl_4$), the growth temperature is typically from about 800° C. to about 950° C. By adding chlorine to $SiH_4$, the growth temperature can be raised to above 600° C. The growth rate of the nanowires 103 depends on the growth temperature and the gas pressure in the growth chamber. For example, a typical CVD growth rate of silicon nanowires grown with $SiH_4$ diluted with $H_2$ (1:1) at a pressure of 1 torr and a growth temperature of 450° C. is about 7.6 μm/hour.

The anisotropic growth of the nanowires is believed to be best described by the vapor-liquid-solid (VLS) mechanism. See, for example, E. I. Givargizov, "Highly Anisotropic Crystals", Kluwer Academic Publishers, Norwell, Mass., 1986. When the growth is initiated, a metallic-silicon liquid alloy 102A such as shown in FIG. 1C is formed. With additional supply of Si from the gas phase (e.g., $SiH_4$), the metallic-silicon droplet becomes supersaturated with Si and the excess silicon is deposited at the solid-liquid interface. As a result, the liquid droplet 102A rises from the original substrate surface to the tip of a growing nanowire crystal. If the growth temperature is kept below about 500° C. (if, $SiH_4$ is used), or alternatively, a chlorine additive is used, no deposition of silicon take places on the program oxide 101 surface.

The orientation of each of the nanowires 103 matches that of the crystalline oxide 101 since it is seeded from that layer. For example, when the crystalline oxide 101 has a (111) orientation then the nanowire orientation is (111) as it is seeded from the crystalline oxide 101. This is why a crystalline oxide 101 that mimics the substrate's orientation is typically preferable. The fabrication of the nanocrystals by nanowire growth facilitates the formation of nanocrystals with near identical length, size, and orientation.

Figure 1D:
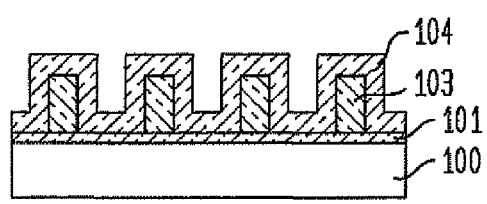

Referring to FIG. 1D, the catalyst 102 is removed by selective etching. It is noted that when the wafer is cooled down below the Au—Si eutectic temperature (about 370° C.) the gold and silicon mixture will separate without forming a Au—Si solid alloy. As a result the liquid alloy 102A reverts back to a catalyst particle 102. For example, aqua regia (a mixture of nitric acid and hydrochloric acid) will selectively etch the catalyst 102 with respect to the program oxide 101 and the silicon nanowires 103. The silicon surface is cleaned and passivated and a control oxide 104 is blanket deposited over the structure. The control oxide 104 is typically made thicker than the program oxide (e.g., for about 5 to about 15 nm) and is conformal. Examples of control oxides 104 that can be employed in the present invention comprise $SiO_2$, $Al_2O_3$, $Ta_2O_5$, $HfO_2$, $TiO_2$ and other like gate dielectric oxides.

Figure 1E:
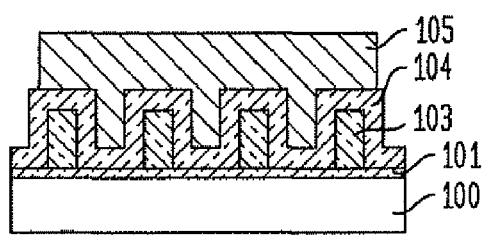

Referring to FIG. 1E a gate conductor 105 such as doped polysilicon, SiGe, a conductive metal, a conductive metal alloy or a metal silicide is deposited over the structure. The polysilicon can be in-situ doped or post-doped by ion implantation and annealing. The gate is patterned to form a MOS capacitor structure by conventional lithography and RIE. The RIE chemistry is typically HBr based to provide a high etching selectivity of the gate conductor 105 with respect to the control oxide 104.

Figure 2A:
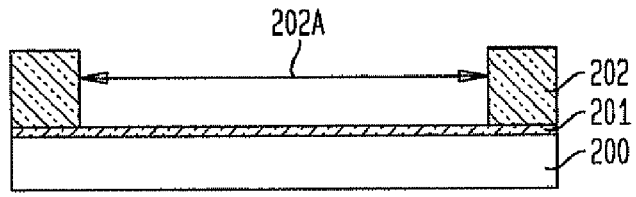
FIGS. 2A-2H are pictorial representations (through cross sectional views) illustrating the basic processing steps of another embodiment of the present invention for fabricating a non-volatile memory transistor with a floating-gate comprised of short nanowires.

FIGS. 2A-2H show another process flow for making a nanocrystal-based floating-gate non-volatile memory transistor. These drawings also describe another method to define the gate which is based on the use of chemical mechanical polishing (CMP) rather than RIE. Referring to FIG. 2A a silicon-containing substrate 200 is used as the starting substrate. The Si-containing substrate is typically chosen to have the (111) orientation so that the nanowires growth will be perpendicular to the substrate surface. A crystalline program oxide 201 is blanket deposited on the substrate 200. A dielectric film 202 such as silicon nitride ($Si_3N_4$) or silicon oxynitride (SiON) is deposited over the program oxide 201. The dielectric film 202 can be deposited by methods such as CVD, PECVD, evaporation, ALD and other like deposition processes. The dielectric film 202 is patterned to include openings 202A at those locations where a transistor is required.

Figure 2B:
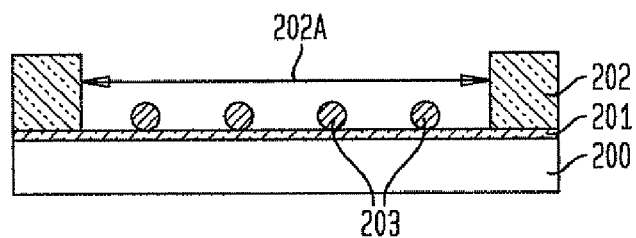

Referring to FIG. 2B catalyst particles 203 are deposited over the exposed program oxide 201 in the openings 202A. It is noted that it is also possible to blanket deposit the catalyst particles 203 prior to the deposition of the film 202, then deposit the dielectric film 202, and finally make openings 202A to expose the catalyst in those regions where a transistor is required. Properties of the catalyst particles and methods for dispensing them are similar to those discussed in reference to FIG. 1B.

Figure 2C:
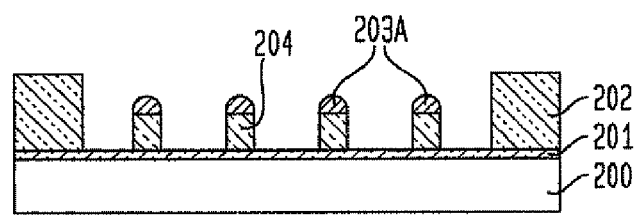

FIG. 2C shows catalyst assisted growth of nanowires 204 in the openings 202A. Reference numeral 203A defines a metallic-silicon liquid alloy. The growth of the nanowires 204 is epitaxial. As a result, the nanowires 204 are perpendicular to the substrate surface and they mimic the program oxide 201 crystal orientation. Following the growth, the catalyst 203, at the tip of each nanowire is removed by selective etching.

Figure 2D:
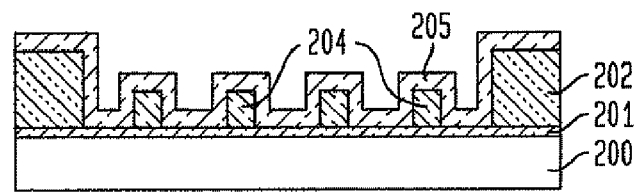
Figure 2E:
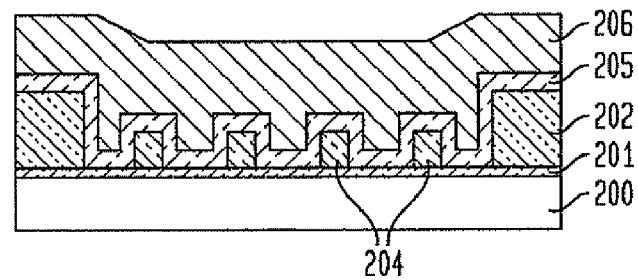

Referring to FIG. 2D a control oxide 205 is blanket deposited over the structure. The control oxide properties are similar to that discussed in reference to FIG. 1D. A gate conductor 206 such as, for example, doped polysilicon, is blanket deposited over the structure as illustrated in FIG. 2E. The polysilicon can be in-situ doped or post-doped by ion implantation and annealing.

Figure 2F:
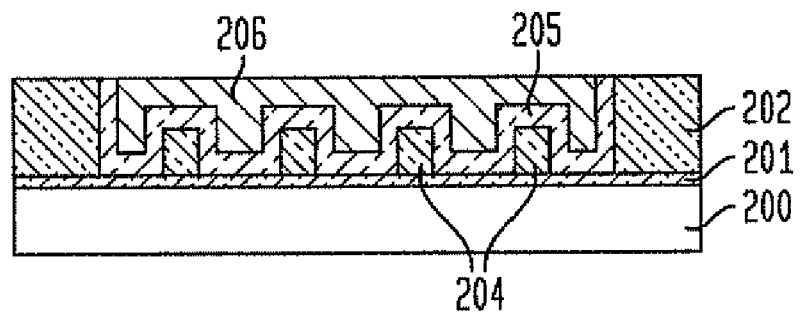

The gate conductor 206 is shaped into a gate line by CMP. The CMP step removes the excess gate material above the top surface of film dielectric 202. Dielectric film 202 is typically chosen such that it will provide high polishing resistance with respect to the gate conductor 206. Following the CMP step, a planarized structure is obtained as illustrated in FIG. 2F.

Figure 2G:
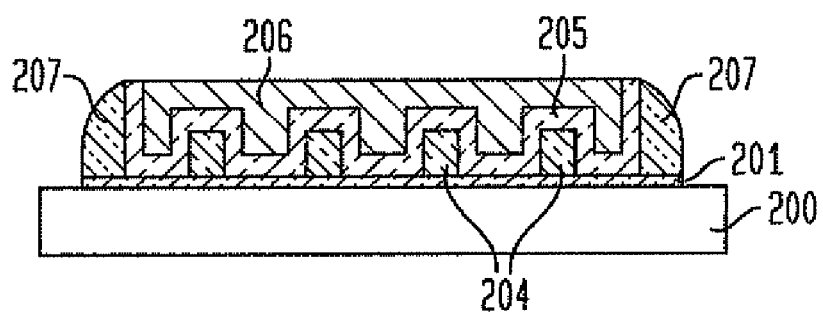
Figure 2H:
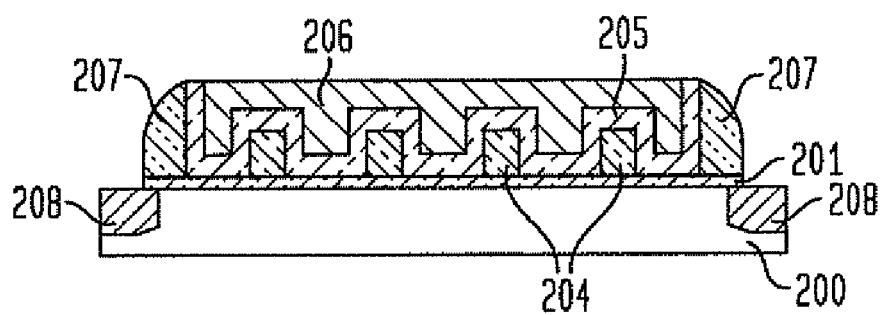

Referring to FIGS. 2G and 2H, dielectric film 202 is selectively etched and a spacer 207 is formed. The spacer 207 is a gate spacer that is similar to that of conventional metal-oxide-semiconductor field effect transistors (MOSFETs) as it used for offsetting the source/drain implants and prevents bridging of the silicide in a self-aligned silicide (SALICIDE) step. Source and drain regions 208 are formed by a self-aligned implant (FIG. 2H). The source, drain and top gate surfaces are silicided by a conventional SALICIDE step, and contacts are formed to complete the device fabrication (not shown).

FIGS. 3A-3D illustrate another embodiment where the floating gate transistor consists of nanocrystals of two distinct sizes. As was explained earlier, the catalyst size defines the diameter of the nanowire which growth is assisted by the catalyst. Therefore, if catalyst particles having two distinct sizes are co-dispensed on the wafer, the catalyst-assisted growth would produce nanowires with two corresponding diameters. A floating gate with two distinct nanocrystal sizes may allow the storage of multiple bits per one memory cell since the charging energy for the smaller crystals is higher than for the larger ones.

Figure 3A:
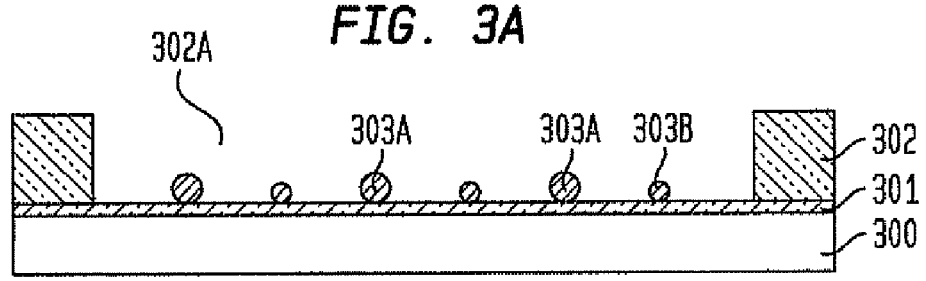
FIGS. 3A-3D are pictorial representations (through cross sectional views) illustrating the basic processing steps of yet a further embodiment of the present invention for fabricating a non-volatile memory transistor with a floating-gate comprising a plurality of short nanowires with two sizes.

Referring to FIG. 3A a crystalline program oxide 301 is deposited over a silicon-containing (111) substrate 300. A dielectric film 302 such as silicon nitride is blanket deposited over the program oxide 301. Openings 302A are made in the film 302 in those regions where a floating gate will be formed. Catalyst particles of two sizes 303A and 303B are deposited over the exposed program oxide 301 in the openings 302A. The deposition of the catalyst particles was discussed in reference to FIGS. 1B and 2B.

Figure 3B:
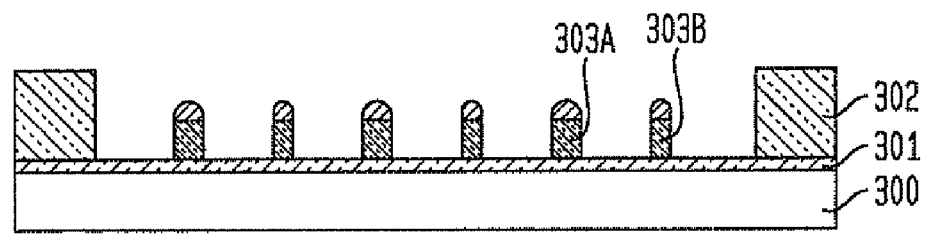

Referring to FIG. 3B, nanowires of two distinct diameters are grown from the catalyst 303A and 303B. The diameter of each of the nanowires corresponds to the catalyst particle size that assists their growth. It is noted that for most growth conditions the growth rate does not depend on the nanowire diameter. As a result, the obtained nanowires length is similar to both nanowires with small and large diameters.

Figure 3C:
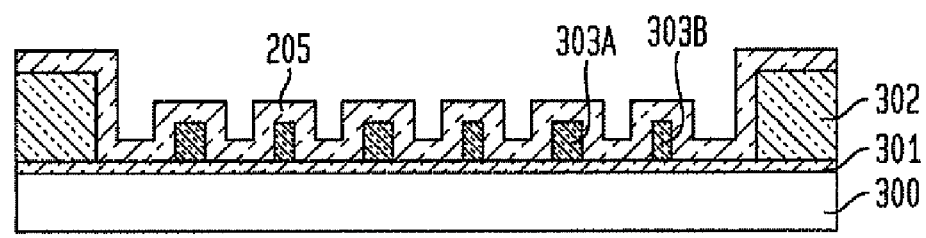
Figure 3D:
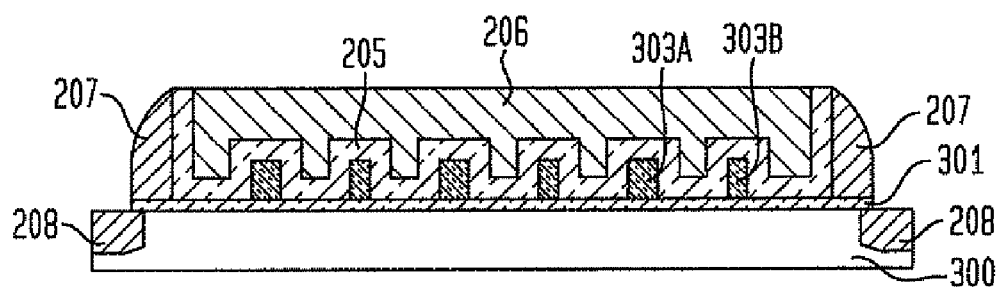

FIGS. 3C and 3D show the remaining process steps as discussed in more details for FIGS. 2D-2H. The fabricated device has two distinct sizes of nanocrystals that were obtained by growth of nanowires.

In another embodiment of the present invention, a self-limited growth of short nanowires provides nanocrystals of uniform length. By choice of growth conditions, the catalyst loss rate can be increased such that the nanowires growth becomes self-limited. This method can also be used for growth over amorphous dielectrics although the obtained nanowires are not guaranteed to be of the same crystal orientation. An example of such a self-limited growth of nanowires is typically observed when growing germanium nanowires at a low pressure (several millitorrs) and relatively a high temperature (on the order of about 330° to about 500° C.). For comparison, it is noted that typical germanium nanowires growth conditions are at a pressure of least several torrs and a temperature in the range of about 270° to about 320° C.

Figure 4:
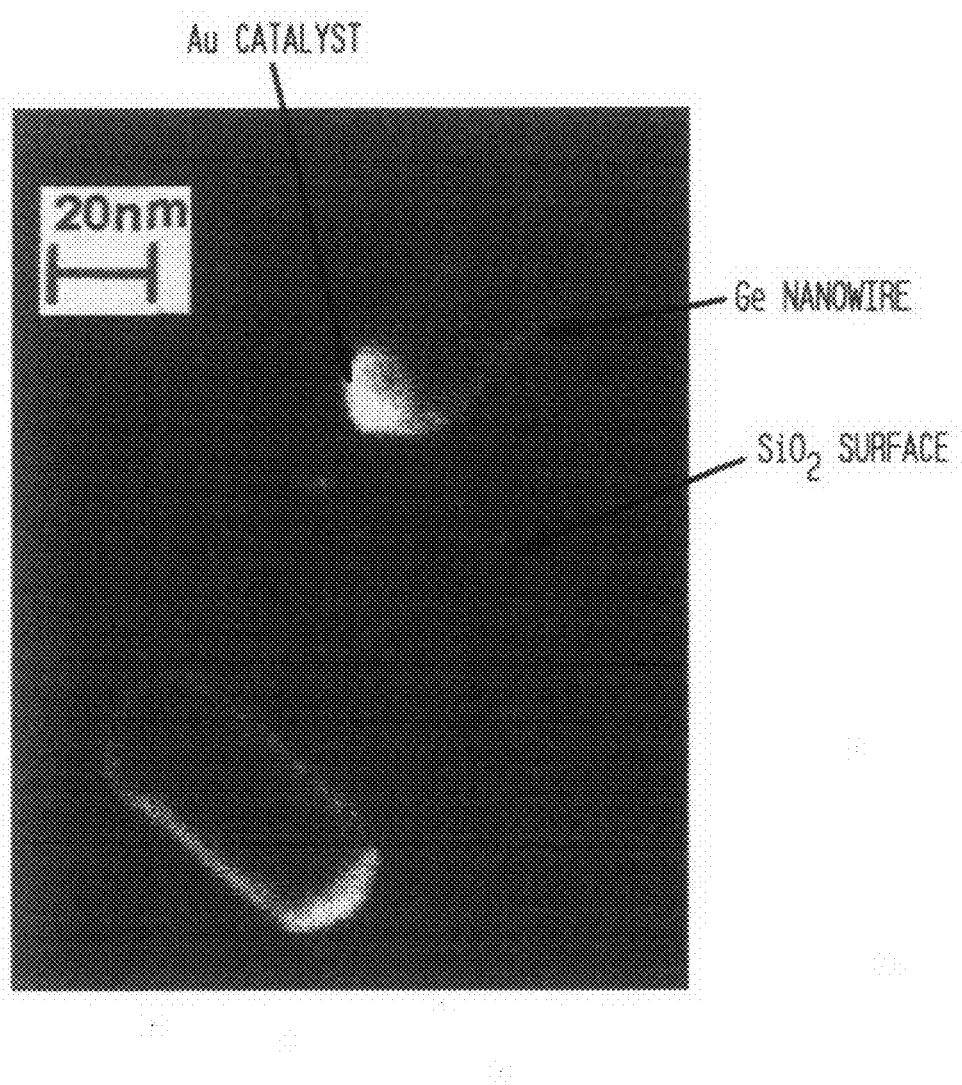
FIG. 4 is a scanning electron microscope (SEM) image showing germanium nanocrystals fabricated by a self-limited growth of germanium nanowires.

FIG. 4 shows a scanning electron microscope (SEM) image of germanium nanowires grown over amorphous $SiO_2$. The catalyst source was a gold colloid with particle size of 20 nm. The growth was carried out in an UHV-CVD chamber using germane ($GeH_4$) with a flow of about 60 sccm. The growth temperature was 450° C.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor structure comprising:
   epitaxially growing a crystalline program oxide over a surface of a semiconductor substrate;
   placing a plurality of catalyst particles over said program oxide;
   growing nanowires perpendicular to the substrate surface from said catalyst particles;
   forming a control oxide over said nanowires and said program oxide;
   forming a gate conductor over said control oxide; and
   patterning said gate conductor.

2. The method of claim 1 wherein said placing said catalyst particles comprises depositing metallic catalyst colloids using a spin-on coating process, wherein said metallic catalyst colloids include one of Au, Ga, Al, Ti or Ni.

3. The method of claim 1 wherein said catalyst particles have at least one distinctive diameter.

4. The method of claim 1 wherein said patterning is by reactive-ion etching or chemical mechanical polishing.

5. The method of claim 1 further comprising forming a source region and a drain region into the semiconductor substrate adjacent to said gate conductor.

6. A method of forming a semiconductor structure comprising:
   forming a program oxide over a surface of a semiconductor substrate;
   placing a plurality of catalyst particles over said program oxide;
   growing nanowires from said catalyst particles where growth of said nanowires is self-limited due to catalyst loss;
   forming a control oxide over said nanowires and said program oxide;
   forming a gate conductor over said control oxide; and
   patterning said gate conductor.

7. The method of claim 6 wherein said placing said catalyst particles comprises depositing metallic catalyst colloids using a spin-on coating process, wherein said metallic catalyst colloids include one of Au, Ga, Al, Ti or Ni.

8. The method of claim 6 wherein said catalyst particles have at least one distinctive diameter.

9. The method of claim 6 wherein said patterning is by reactive-ion etching or chemical mechanical polishing.

10. The method of claim 6 further comprising forming a source region and a drain region into the semiconductor substrate adjacent to said gate conductor.

* * * * *